United States Patent
Quan (10) Patent No.: US 11,949,424 B2
(45) Date of Patent: Apr. 2, 2024

(54) DEVICE, METHOD AND STORAGE MEDIUM FOR FREQUENCY CALIBRATION FOR VOLTAGE-CONTROLLED OSCILLATORS

(71) Applicant: SHENZHEN ZHONCENT TECHNOLOGIES CO., LTD., Guangdong (CN)

(72) Inventor: Zhi Quan, Guangdong (CN)

(73) Assignee: SHENZHEN ZHONCENT TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/743,902

(22) Filed: May 13, 2022

(65) Prior Publication Data

US 2022/0278689 A1    Sep. 1, 2022

Related U.S. Application Data

(63) Continuation of application No. PCT/CN2020/139102, filed on Dec. 24, 2020.

(51) Int. Cl.
*H03L 7/099* (2006.01)
*H03L 7/085* (2006.01)
*H03L 7/197* (2006.01)

(52) U.S. Cl.
CPC ............ *H03L 7/099* (2013.01); *H03L 7/085* (2013.01); *H03L 7/1974* (2013.01); *H03L 2207/50* (2013.01)

(58) Field of Classification Search
CPC ....... H03L 2207/50; H03L 7/085; H03L 1/00; H03L 7/08; H03L 7/00; H03L 1/026; H03L 1/022; H03B 5/04; H03B 5/32; H03B 5/36
See application file for complete search history.

(56) References Cited

U.S. PATENT DOCUMENTS

2006/0145767 A1    7/2006  Vaananen
2011/0095834 A1*   4/2011  Fedan ............... H03B 5/32
                                            331/158

(Continued)

FOREIGN PATENT DOCUMENTS

| CN | 102480290 A | * | 5/2012 | ............ H03L 7/16 |
| CN | 102656804 A |   | 9/2012 | |
| CN | 105959003 A |   | 9/2016 | |

OTHER PUBLICATIONS

The International Search Report issued in corresponding International Application No. PCT/CN2020/139102, dated Sep. 24, 2021.

(Continued)

*Primary Examiner* — Ryan Johnson
(74) *Attorney, Agent, or Firm* — HAUPTMAN HAM, LLP (57) ABSTRACT

The present disclosure provide a device, method and storage medium for frequency calibration for voltage-controlled oscillators. The device includes: A frequency divider connected with a VCO, a time-digital converter connected with the frequency divider, a logic controller connected with the time-digital converter, a digital-to-analog converter connected with the voltage-controlled oscillator; The frequency divider is used to divide the signal generated by the voltage-controlled oscillator into N times to get the frequency divider signal; Time-digital converter is used to measure the actual time period of frequency division signal; And the logic controller is used to generate the control voltage according to the difference between the actual time period of the frequency division signal and the calibration period of the frequency division signal, and adjust the frequency of the VCO according to the control voltage. The frequency precision of VCO is improved and the model-free adaptive frequency calibration of VCO is realized.

8 Claims, 6 Drawing Sheets

(56) References Cited

U.S. PATENT DOCUMENTS

2016/0380759 A1* 12/2016 Kondo .................. H04L 7/0332
375/376
2019/0356320 A1* 11/2019 Seo ....................... H03L 7/0992
2020/0021300 A1* 1/2020 Sudo ........................ H03B 5/04
2020/0192301 A1* 6/2020 Khoury .................. H03L 7/085

OTHER PUBLICATIONS

Hou, Zhongsheng, et al. : "An Overview of Dynamic-Linearization-Based Data-Driven Control and Applications", IEEE Transactions on Industrial Electronics, May 31, 2017 (May 31, 2017), vol. 65, issue 5, section 5.

* cited by examiner

DEVICE, METHOD AND STORAGE MEDIUM FOR FREQUENCY CALIBRATION FOR VOLTAGE-CONTROLLED OSCILLATORS

CROSS-REFERENCE TO RELATED APPLICATION(S)

This application is a continuation of International Application No. PCT/CN2020/139102, filed on Dec. 24, 2020, the entire disclosures of which is incorporated herein by reference.

TECHNICAL FIELD

Implementations of the present disclosure relates to the technical field of communications, and in particular, to a device, method and storage medium for frequency calibration for voltage-controlled oscillators.

BACKGROUND

Orthogonal Frequency Division Multiplexing (OFDM) has been adopted as a modulation scheme in many wireless communication standards, such as Digital Video Broadcasting (DVB), Wireless Local Area Network (WLAN), Narrow Band-Internet of Things (NB-IoT), and so on. Meanwhile, IEEE 802.11ax and 5G wireless communication systems implement Orthogonal Frequency Division Multiple Access (OFDMA), an OFDM-based, multiple access technology. The success of OFDM is mainly due to its high spectral efficiency and ability to deal with severe propagation delay dispersion without the need for a complex channel equalizer. However, OFDM systems are very sensitive to frequency synchronization errors, known as the carrier frequency offset (CFO), which destroys the orthogonality of subcarriers. Consequently, the received OFDM signal suffers from many deformations including attenuation, phase rotation, and inter carrier interference (ICI), leading to detection errors. On the other hand, a reduced CFO can effectively prolong the lifetime of communication equipment, as shown in, for NB-IoT terminal devices. A major source of CFO is the frequency mismatch between local oscillators in the transmitter and the receiver. Therefore, the frequency accuracy of a crystal oscillator is so important that it can affect the overall performance of a wireless communication system.

The frequency accuracy of a crystal oscillator is defined as the difference between the operating frequency and the normal frequency over the nominal frequency. In general, the accuracy values range on the scale of $10^{-6}$ or $10^{-9}$ relative to nominal frequency, denoted as part per-million (ppm) or part per-billion (ppb) respectively. There are many factors that affect the frequency accuracy of a crystal oscillator including load capacitance, ambient temperature, operating voltage, and so on. For example, the capacitive load applied on the crystal oscillators has an accuracy of around 5%, which leads to the frequency offset. Also, the aging factor of a crystal oscillator slowly alternates its operating frequency over time. Other imperfections originated from the manufacturing process make it impossible to ensure a completely consistent set of parameters for crystal oscillators. These factors and others have the operating frequency vary from the nominal frequency. Such variation, even if it is small within s few ppm, could have a fatal effect on the wireless communication systems. For example, a frequency error of just 1 ppm introduces carrier frequency offsets of 2.4 kHz and 5 kHz for wireless communication systems working on 2.4 GHz and 5 GHz bands. Meanwhile, the CFO requirement of emerging wireless communication systems is becoming more and more stringent. For instance, IEEE 802.11n/ac allows a sub-carrier spacing of 312.5 kHz, but the latest IEEE 802.11ax standard has a sub-carrier spacing significantly reduced to 78.125 kHz. This evolution implies that the frequency accuracy of local oscillators is becoming more and more important.

To mitigate the effect of the aforementioned factors and deliver lower frequency offset from crystal oscillator, there are many approaches focusing on protecting the crystal oscillator from external temperature variation to increase its operating frequency accuracy. The current state-of-the-art is the oven controlled oscillator (OCXO), which encloses the oscillator within a precisely controlled environment with constant temperature. Therefore, it can generate an operating frequency with an error of several ppb. Nevertheless, the constant temperature oven makes it most expensive with high power consumption for heating and thus with a large volume, limiting the use of this technique only in high-priced and special-purpose instruments. For consumer electronics with high integration and low power consumption requirements, such as mobile phones and IoT devices, the requirement on environmental temperature is relaxed to implement a small low-cost oscillator with lower power consumption. The temperature-compensated crystal oscillator (TCXO) is specially structured to compensate stress on crystal oscillators at different temperature to reduce the influence of temperature to some accepted extent. Notwithstanding, other sources of frequency offset, such as load capacitance, working voltage, and manufacturing imperfection, still affect the accuracy of the crystal oscillator.

Calibration is a cost-effective technique to improve the frequency accuracy of crystal oscillators. A voltage-controlled oscillators (VCO) can be calibrated by adjusting the voltage on its internal variable capacitor to control the generated frequency. In this regard, many calibration methods have been proposed in the literature.

The temperature-compensated phase locked loop (TCPLL) was proposed to calibrate the crystal oscillator by tuning the internal parameter of PPL based on the temperature to maintain an accurate carrier frequency. Although this method can greatly reduce the temperature impact on the carrier frequency, the TCPLL structure is complicated and the frequency characteristics at different temperatures must be known in advance. The GPS disciplined oscillator (GPSDO) offers another calibration method based on the GPS signal. When the GPSDO device first receives the GPS signal, it generates a stable one pulse per second (1PPS) signal, which is used as the reference in the local crystal oscillator. Despite its high accuracy, stability, and resistance to frequency offset factors like temperature and aging, the GPSDO does not work indoor due to the unavailability of GPS signals because it requires direct line of sight to the satellites. Proposed calibrating the frequency by compensating the crystal oscillator inside the chip, and thus the integrated circuit of the oscillator needs to be redesigned. Proposed generating an accurate 1PPS signal from the microcontroller unit (MCU) by measuring the crystal oscillator period using a time-to-digital converter (TDC) and adjusting the MCU counting step size accordingly, and this method thus can not be used for the VCO frequency calibration.

The accuracy of operating frequency of the local oscillators is critical for the overall system performance of wireless communication systems. However, the high-precision oscillators could be too expensive for civil applications.

SUMMARY

Implementations of the present disclosure provide a frequency calibration scheme for voltage-controlled oscillators.

On the first aspect, providing a device for frequency calibration for voltage-controlled oscillators, comprising: a frequency divider connected with a voltage-controlled oscillator (VCO), a time-digital converter connected with the frequency divider, a logic controller connected with the time-digital converter, a digital-to-analog converter connected with the voltage-controlled oscillator; wherein:

the frequency divider is used to divide the signal generated by the voltage-controlled oscillator into N times to get the frequency divider signal, where N is a positive integer;

time-digital converter is used to measure the time difference of at least two continuous or discontinuous frequency division signals and obtain the actual time period of frequency division signal; and the logic controller is used to generate the control voltage according to the difference between the actual time period of the frequency division signal and the calibration period of the frequency division signal, and adjust the frequency of the VCO according to the control voltage.

Optionally, wherein when the control voltage increase, the period of the frequency division signal decreasing and the frequency of the frequency division signal increase.

Optionally, wherein the frequency division coefficient of the time-digital converter is set according to the resolution of the time-digital converter.

Optionally, wherein the relationship between the control voltage and the actual time period of the frequency division signal is as follows:

$$y(k+1)=f(y(k),\ldots,y(k-n_y),u(k),\ldots,u(k-n_u)),$$

wherein u(k) is the control voltage, y(k) is the period of generated low frequency signal at the k-th time instant.

Optionally, wherein the relationship between the control voltage and the actual time period of the frequency division signal is as follows:

$$\Delta y(k+1)=\varphi(k)\Delta u(k),$$

wherein u(k) is the control voltage, y(k+1) is the period of generated low frequency signal at the k+1-th time instant, $\varphi(k)$ is a time-varying parameter at the k-th time.

Optionally, wherein the logic controller is also used to estimate $\varphi(k)$, get as follows:

$$\hat{\varphi}(k) = \hat{\varphi}(k-1) + \frac{\eta\Delta(k-1)(\Delta y(k) - \hat{\varphi}(k-1)\Delta u(k-1))}{\mu + |\Delta(k-1)|^2}$$

wherein $\hat{\varphi}(k)$ is the estimate of $\varphi(k)$, k is the frequency division coefficient, u(k−1) is the control voltage generated according to the actual time period of measuring k−1 frequency division signal, and y(k) is the period of the frequency division signal generated immediately for the k-th time.

Optionally, wherein the device also comprising the digital-to-analog converter connected with the logic control circuit and the voltage-controlled oscillator respectively; wherein, the digital-to-analog converter is used to convert the control voltage into an analog signal regulating the frequency of the voltage-controlled oscillator.

On the second aspect, providing a method for frequency calibration for voltage-controlled oscillators, applied to a device for a frequency calibration for voltage-controlled oscillators, the device comprising: a frequency divider connected with a voltage-controlled oscillator (VCO), a time-digital converter connected with the frequency divider, a logic controller connected with the time-digital converter, a digital-to-analog converter connected with the voltage-controlled oscillator; wherein:

the frequency divider dividing the signal generated by the voltage-controlled oscillator into N times to get the frequency divider signal, where N is a positive integer;

time-digital converter measuring the time difference of at least two continuous or discontinuous frequency division signals and obtaining the actual time period of frequency division signal; And the logic controller generating the control voltage according to the difference between the actual time period of the frequency division signal and the calibration period of the frequency division signal, and adjust the frequency of the VCO according to the control voltage.

Optionally, wherein when the control voltage increasing, the period of the frequency division signal decreasing and the frequency of the frequency division signal increasing.

Optionally, wherein the device also comprising the digital-to-analog converter connected with the logic control circuit and the voltage-controlled oscillator respectively; wherein, the digital-to-analog converter converting the control voltage into an analog signal regulating the frequency of the voltage-controlled oscillator.

On the third aspect, providing a computer readable storage medium, wherein including instructions that, when run on a computer, cause the computer to perform the method described in the method of the second aspect or any implementation of the second aspect.

On the fourth aspect, providing a computer program product containing instructions that, when run on a computer, cause the computer to perform the method of implementing the second aspect or any of the second aspect based on the instructions is provided.

On the fifth aspect, providing a chip for frequency calibration for voltage-controlled oscillators, perform the method described in the method of the second aspect or any implementation of the second aspect.

It should be noted that "coupling" in the present disclosure refers to the combination of two components directly or indirectly with each other.

Adopting the disclosed scheme has the following beneficial effects:

One advantage is the working frequency calibration employs the system history of input/output (I/O) data, instead of establishing an accurate VCO voltage-controlled oscillator model. Another advantage is the lightweight calibration method with low complexity such that it can be implemented on an MCU with limited computation capabilities. Experimental results show that the proposed calibration method can improve the frequency accuracy of a VCO from ±20 ppm to ±10 ppb, which indicates the promise of the model-free adaptive frequency calibrator for VCOs.

BRIEF DESCRIPTION OF THE DRAWINGS

The accompanying drawings described herein are used to provide a further understanding of the present disclosure and constitute a part of the present disclosure. Exemplary implementations and description of the present disclosure are used to explain the present disclosure and do not constitute an improper limitation for the present disclosure. The accompanying drawings include the following.

DETAILED DESCRIPTION

The technical solutions in implementations of the present disclosure will be described in the following with reference to the accompanying drawings in the implementations of the present disclosure. Apparently, the described implementations are merely a part of rather than all the implementations of the present disclosure. All other implementations obtained by those of ordinary skill in the art based on the implementations of the present disclosure without creative efforts are within the scope of the present disclosure.

The present disclosure proposes a model-free adaptive frequency calibration framework for a voltage-controlled crystal oscillator (VCO) equipped with a time to digital converter (TDC), which can significantly improve the frequency accuracy of the VCO thus calibrated. The idea is to utilize a high-precision TDC to directly measure the VCO period which is then passed to a model-free method for working frequency calibration. One advantage of this method is that the working frequency calibration employs the system history of input/output (I/O) data, instead of establishing an accurate VCO voltage-controlled oscillator model. Another advantage is the lightweight calibration method with low complexity such that it can be implemented on an MCU with limited computation capabilities. Experimental results show that the proposed calibration method can improve the frequency accuracy of a VCO from ±20 ppm to ±10 ppb, which indicates the promise of the model-free adaptive frequency calibrator for VCOs.

Figure 1:
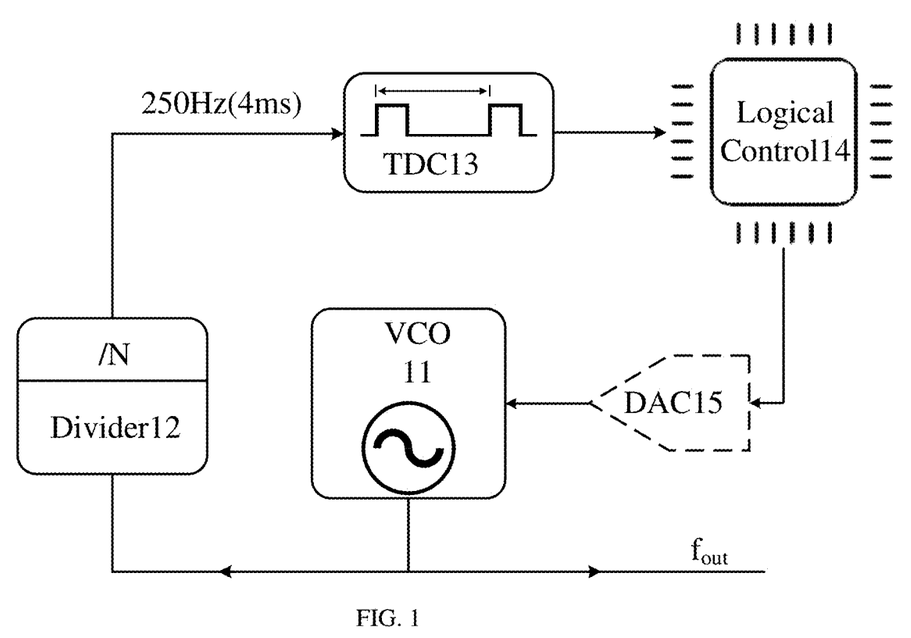
FIG. 1 is a schematic diagram illustrating a device for frequency calibration for voltage-controlled oscillators according to an implementation of the present disclosure.

As shown in FIG. 1, is a schematic diagram illustrating a device for frequency calibration for voltage-controlled oscillators according to an implementation of the present disclosure. In the present disclosure, we introduce the system architecture of the proposed TDC-based frequency calibration scheme and analyze the factors that affect its frequency accuracy.

The proposed system architecture is shown in FIG. 1. The structure is different from GPSDO in that there is no need for GPS timing signal as the reference and only TDC measurements are used during the calibration process. The proposed frequency calibration system includes a TDC, a logic controller, a digital to analog converter (DAC), a VCO and a frequency divider. As shown in FIG. 1, the signal generated from the VCO is divided by N times into a low frequency signal. Thereafter, the TDC is used to measure the actual time period. Due to the frequency variation, there is a difference between the measured period and the nominal period of the low frequency signal. According to the measured periods, the logic controller adjusts the frequency of the VCO by controlling its voltage.

Figure 2:
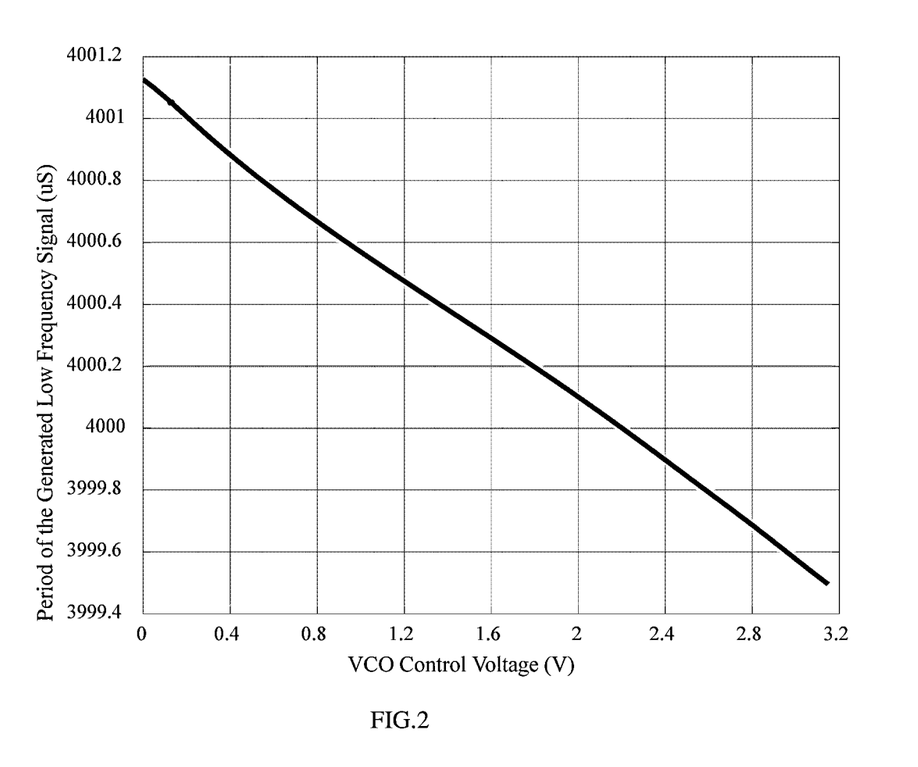
FIG. 2 shows the period of the generated low frequency signal measured by a TDC under different control voltages.

FIG. 2 shows the period of the generated low frequency signal measured by a TDC under different control voltages. The nominal period of the low frequency signal is 4000 us. As the control voltage of the VCO increases, the period of the generated low frequency signal decreases, i.e., the frequency of the generated signal increases. It can be observed from FIG. 2 that there is a nonlinear relationship between the signal period and the VCO control voltage. The nonlinearity has a significant impact on high-precision frequency calibration. In addition, the dynamic characteristics of the VCO cause the generated frequency to shift from its nominal value gradually. Thus, the proposed calibration scheme needs to control the frequency offset of the VCO within a specific range under such nonlinear and dynamic conditions.

The frequency accuracy of a crystal oscillator is usually expressed $$p = \frac{f_m - f_n}{f_n}, \tag{1}$$

where $f_m$ is the operating frequency, and $f_n$ is the nominal frequency. If the frequency accuracy is expressed in terms of period, (1) can be rewritten as $$p = \frac{T_n - T_m}{T_m}, \tag{2}$$

where $T_n$ is the period of $f_n$, and $T_m$ is the period of $f_m$. Therein, $T_m$ can be measured by the TDC. However, there is a measurement error w due to the TDC resolution. Thus, the frequency accuracy is given by $$p = \frac{T_n - T_m - w}{T_m + w}. \tag{3}$$

A high-resolution TDC has a small measurement error w. Therefore, we can see from (3) that the calibration accuracy can be improved by using a high resolution TDC or a longer measurement time period $T_m$. Ideally, if the resolution of the TDC is high enough or the measurement time period is long enough, we can achieve a very accurate operating frequency. However, the measurement time period is limited by the TDC range. If the measure time period exceeds the measurement range of the TDC, the result becomes inaccurate. On the other hand, although the TDC has a very high resolution, the measurement error increases when measuring long-time periods. Therefore, it is necessary to select an appropriate frequency division factor with respect to the TDC to achieve the expected frequency accuracy. In order to balance the measure time period and the measurement resolution, we choose the measure time period to be 4 ms. In this manner, the measurement time period is long enough, and the TDC has enough resolution.

Wherein, the proposed model free frequency calibration algorithm, which is based on the equivalent linear model of a nonlinear dynamic system.

a. Dynamic Linearization Data Model

We use expression (4) to express the relationship between the VCO control voltage and the period of the generated low frequency signal as a general discrete-time system:

$$y(k+1)=f(y(k),\ldots,y(k-n_y),u(k),\ldots,u(k-n_u)) \quad (4)$$

where u(k) and y(k) are the VCO control voltage and the period of generated low frequency signal at the k-th time instant, respectively. ny and nu are two unknown integers, representing the order of the system. f(•) is an unknown nonlinear function. The system in expression (4) is called the nonlinear autoregressive exogenous (NARX) model. As can be seen from expression (4), this model is only based on the input and output historical data of the system, and does not need the internal state information. The NARX model has been widely used in neural networks and became one of the most widely studied models in neural networks.

For some complex nonlinear systems, the order $n_y$ and $n_u$ should be chosen appropriately. In this paper, the relationship between y and u can be expressed as a slow time-varying nonlinear system, i.e., $$y(k)=f(y(k-1),u(k-1),u(k-2)) \quad (5)$$

For a nonlinear time-varying system, we can transform it into a dynamic linear system under the following two conditions:

1) The partial derivatives of f(•) with respect to VCO control voltage u(k) are continuous.

2) The nonlinear function f(•) satisfies the generalized Lipschitz condition, i.e., $$|\Delta y(k)| \leq b|\Delta u(k)|, \forall k \quad (6)$$

where $$\Delta y(k)=y(k)-y(k-1) \quad (7)$$

$$\Delta u(k)=u(k)-u(k-1), |\Delta u(k)| \neq 0 \quad (8)$$

and b is a positive constant.

For a physically realizable system, these two conditions are reasonable. As the change rate of VCO control voltage u(k) is always finite, we can reasonably assume that the derivative of f(•) with respect to u(k) is continuous. In addition, for a stable system, if the input is bounded, the output produced is also bounded.

For a system that satisfies these two conditions, we can transform it into a dynamic linear system, i.e., $$\Delta y(k+1)=\varphi(k)\Delta u(k), \quad (9)$$

where $\varphi(k)$ is called the pseudo-partial derivative (PPD), $\varphi(k)$ is a time-varying parameter, and $|\varphi(k)| \leq b$.

From (9) we can see that a complex nonlinear system can be simplified into a dynamic linear system. The dynamic features of a nonlinear system, such as nonlinear, time-varying characteristics, etc. are incorporated into one parameter $\varphi(k)$. Therefore, the dynamic characteristics of $\varphi(k)$ could be very complicated and difficult to describe mathematically, but its numerical behavior can be calculated.

b. Frequency Calibration

The proposed model-free calibration method iteratively reduces the error between the signal period and a target value y* using the historical input and output data. As discussed above, $\varphi(k)$ represents the time-varying characteristics of the system at k-th time instant. If we know the time-varying characteristics of the system at time k-th instant, then we can estimate the VCO control voltage. There are many different methods to estimate $\varphi(k)$. In this paper, we use a modified projection algorithm to estimate $\varphi(k)$. The criteria function of PPD is defined as $$J(\hat{\varphi}(k))=|\Delta y(k)-\hat{\varphi}(k)\Delta u(k-1)|^2+\mu|\hat{\varphi}(k)-\hat{\varphi}(k-1)|^2 \quad (10)$$

Where $\hat{\varphi}(k)$ is the estimate of $\varphi(k)$, and $\mu>0$ is a weighting factor to punish the change rate of $\varphi(k)$. By solving the following optimal condition, $$\frac{\partial J(\hat{\varphi}(k))}{\partial \hat{\varphi}(k)}=0 \quad (11)$$

we have $$\hat{\varphi}(k)=\hat{\varphi}(k-1)+\frac{\eta\Delta(k-1)(\Delta y(k)-\hat{\varphi}(k-1)\Delta u(k-1))}{\mu+|\Delta(k-1)|^2} \quad (12)$$

where $\rho \in (0, 1]$ is the step length constant. This parameter is added to make the algorithm more flexible. In order to enable the algorithm to have stronger time-varying tracking ability, and guarantee $|\Delta u(k-1)|6=0$, we use the following reset method, i.e., $$\hat{\varphi}(k)=\varphi(1), \text{ if, } |\hat{\varphi}(k)| \leq \varepsilon,$$

$$\text{or, } |\Delta u(k-1)| \leq \varepsilon$$

$$\text{or, sign}(\hat{\varphi}(k)) \neq \text{sign}(\varphi(1)) \quad (13)$$

where $\varphi(1)$ is the initial value of PPD and $\varepsilon$ is a small positive constant.

After estimating the PPD, we know the characteristics of the system at the k-th time instant, and we can further estimate the input u(k) using this characteristic. For a given target value y*, the proposed scheme finds an input value u(k), at which the output y(k) is as close to y* as possible. Consider the following criterion function, $$J(u(k))=|y^*-y(k+1)|^2+\lambda|u(k)-u(k-1)|^2 \quad (14)$$

where y* is the target value, $\lambda>0$ is a weighting factor used to restrict the changing rate of the u(k), a reasonable $\lambda$ value makes the system more stable and with better output performance. Solving the optimal condition:

$$\frac{\partial J(u(k))}{u(k)}=0 \quad (15)$$

gives the input value u(k) as $$u(k)=u(k-1)+\frac{\rho\hat{\varphi}(k)(y^*-y(k))}{\lambda+|\hat{\varphi}(k)|^2} \quad (16)$$

where $\rho \in (0, 1]$ is the step-length constant to make (16) more general. After a few iterations, the output value y(k) will gradually converge to the target value y*.

Figure 3:
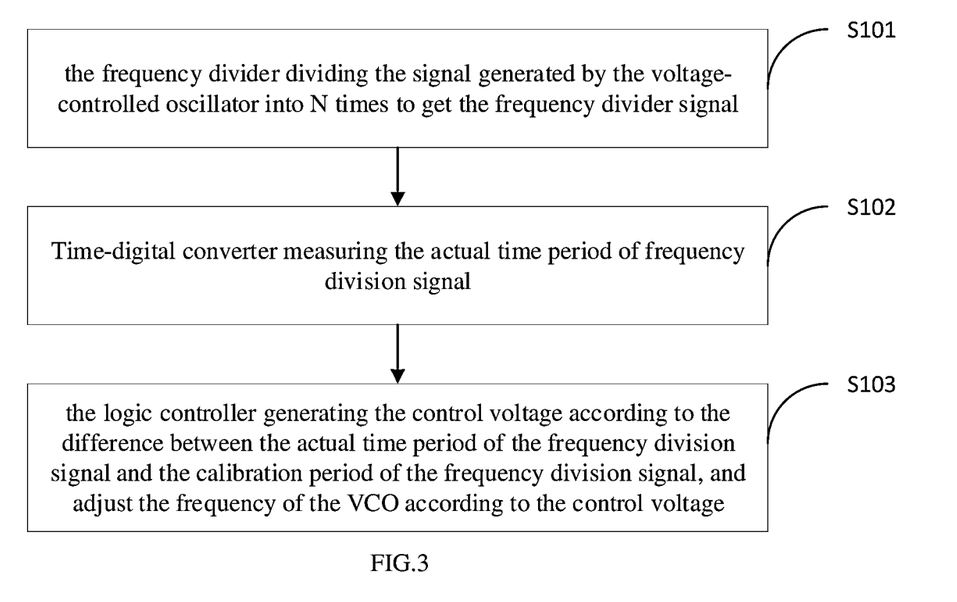
FIG. 3 is a schematic diagram illustrating a method for frequency calibration for voltage-controlled oscillators according to an implementation of the present disclosure.

As shown in FIG. 3, is a schematic diagram illustrating a method for frequency calibration for voltage-controlled oscillators according to an implementation of the present disclosure, the method can be applied in the device as shown in FIG. 1. The method may comprise:

S101, the frequency divider dividing the signal generated by the voltage-controlled oscillator into N times to get the frequency divider signal, where N is a positive integer.

S102, Time-digital converter measuring the actual time period of frequency division signal.

S103, the logic controller generating the control voltage according to the difference between the actual time period of the frequency division signal and the calibration period of the frequency division signal, and adjust the frequency of the VCO according to the control voltage.

During implementation, the signal generated from the VCO is divided by N times into a low frequency signal. Thereafter, the TDC is used to measure the actual time period. Due to the frequency variation, there is a difference between the measured period and the nominal period of the low frequency signal. According to the measured periods, the logic controller adjusts the frequency of the VCO by controlling its voltage. The digital-to-analog converter converts the control voltage into an analog signal regulating the frequency of the voltage-controlled oscillator.

In this section, we experimentally evaluate the performance of the proposed model free adaptive frequency calibration scheme. The experiments are carried out in an environment with almost constant temperature, and the measurement results of the TDC are relatively stable.

The main components in the circuit board include TDC, VCO, DAC, MCU and complex programmable logic device (CPLD). The VCO has a nominal frequency 40 MHz. The controllable voltage range is 0-3.15V, and the frequency adjustable range is greater than ±100 ppm. Using a universal frequency counter to measure the frequency of the VCO, we found that the actual work frequency of the VCO is 39.989447939 MHz and 40.007946938 MHz at a control voltage of 0V and 3.15V, respectively. That is, the actual adjustable frequency accuracy range is from −260 ppm to 200 ppm, a total of 460 ppm. The DAC has a resolution of 20-bit. That is, the adjustable frequency range of each step of DAC is about $460/2^{20}$ ppm=0.439 ppb. The measurement range and resolution of the TDC determine the calibration accuracy. In this experiment, the TDC chosen has a measurement range of 16 s and a measurement resolution of 10 ps. The CPLD is used to divide the frequency of the 40 MHz signal to generate the start and stop pulse signals for the TDC measurement. We know that the higher the resolution or the longer the measurement range, the higher the accuracy of calibration. In this experiment, we find that the measurement resolution of the TDC is greatly reduced when measuring long time interval pulses. In order to balance the measure time period and the measurement resolution, we choose a measurement time period of 4 ms. That is, CPLD divides the frequency of the 40 MHz signal by 160000 to obtain a signal with a nominal period of 4 ms.

During the experiment, we found that there is a fixed time difference between the start and stop generated by the CPLD frequency division of the 40 MHz signal. When the TDC measurement value needs to converge to 3999.984480 us, the actual output frequency value will approach 40 MHz. This behavior is caused by the inconsistent delay of the start and stop signals in the verification circuit after the CPLD synthesis.

According to the TDC measurement value sent by the MCU, the historical measurement value and the historical VCO control voltage, the control computer uses the proposed model free adaptive scheme to calculate the next VCO control voltage, and sends it to the MCU to adjust the output frequency of the crystal oscillator. Through iterative adjustments, the period of the generated low frequency signal is adjusted to the desired value using the proposed frequency calibration scheme. The universal frequency counter is used to verify the actual effect of frequency calibration.

The process of the proposed model free adaptive frequency calibration algorithm is summarized in Algorithm 1, where u(1), φ(1), Δy(1), Δu(1) are the initial values of the system, and η, μ, ρ, λ are the parameters to be optimized. Usually, the frequency accuracy of the VCO is very high when the control voltage is half of the maximum value, so we can use it as the initial value. The value and sign of φ(1) are very important for the convergence speed and the stability of the algorithm, so this parameter needs to be carefully optimized.

Figure 4:
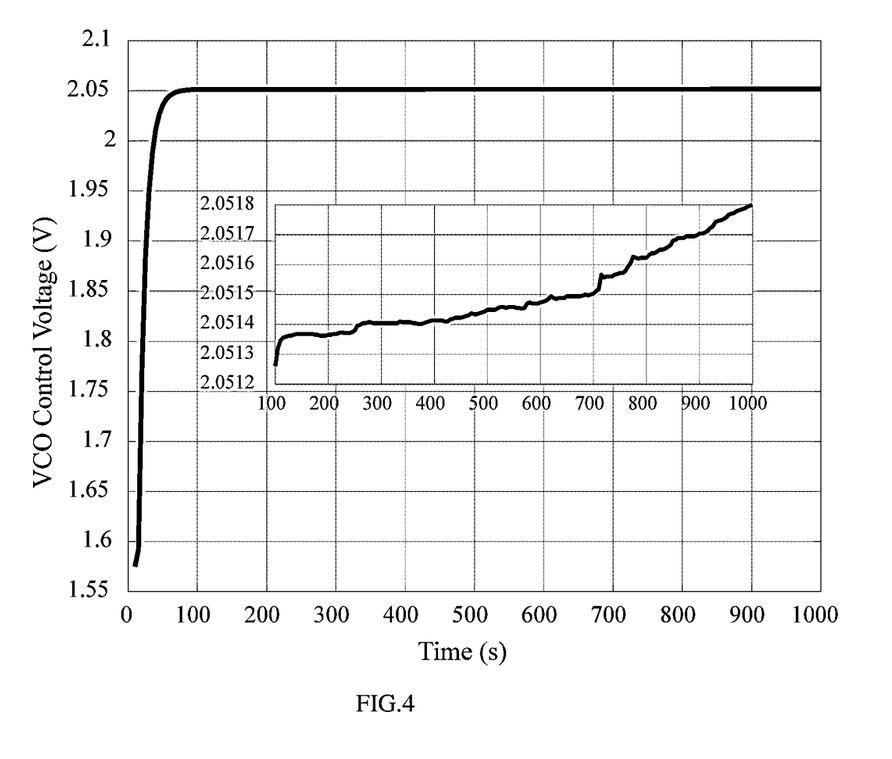
FIG. 4 is a schematic diagram illustrating VCO control voltage versus time according to an implementation of the present disclosure.
Figure 5:
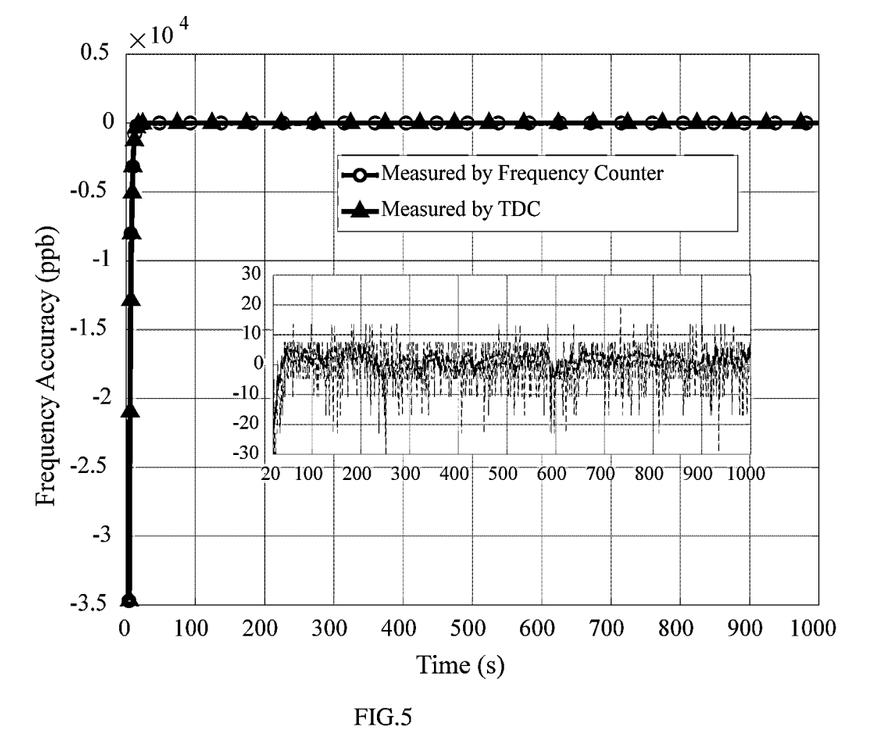
FIG. 5 is a schematic diagram illustrating calibration error versus time according to an implementation of the present disclosure.

During calibration, in order to reduce the error of the TDC measurement, we take the average value of 10 measurements as a measurement value. The calibration process is performed every 5 seconds. FIG. 4 shows the change of the VCO control voltage over time. We can see that after less than 20 calibrations, i.e. 40 seconds, the VCO control voltage becomes stable. However, the VCO control voltage increases slowly over time as the state of the VCO changes. The state change of the VCO may be caused by temperature variation or other factors. The calibration accuracy is shown in FIG. 5. The calibration accuracy calculated by (2) shows that the accuracy of frequency is within ±30 ppb. The result of the frequency counter measurement shows that the calibration accuracy is less than ±20 ppb. This is mainly due to errors in the TDC measurement, which leads to insufficient accuracy in the calculation of frequency accuracy. However, it can reflect the changing trend of the frequency accuracy.

It can be seen that the initial frequency error of VCO is greater than ±30 ppm. After less than 20 calibrations, the frequency error quickly converges within ±20 ppb. Even though the state of the VCO is slowly changing over time, the proposed model-free adaptive frequency calibration algorithm can track this change well and keep the calibration error within ±20 ppb.

Figure 6:
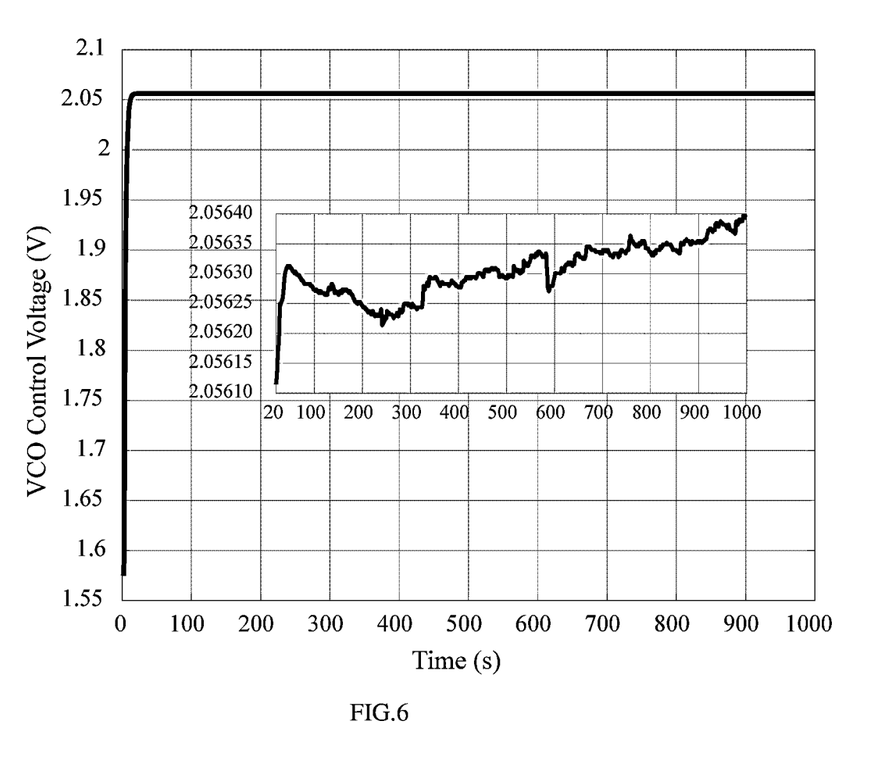
FIG. 6 is another schematic diagram illustrating VCO control voltage versus time according to an implementation of the present disclosure.
Figure 7:
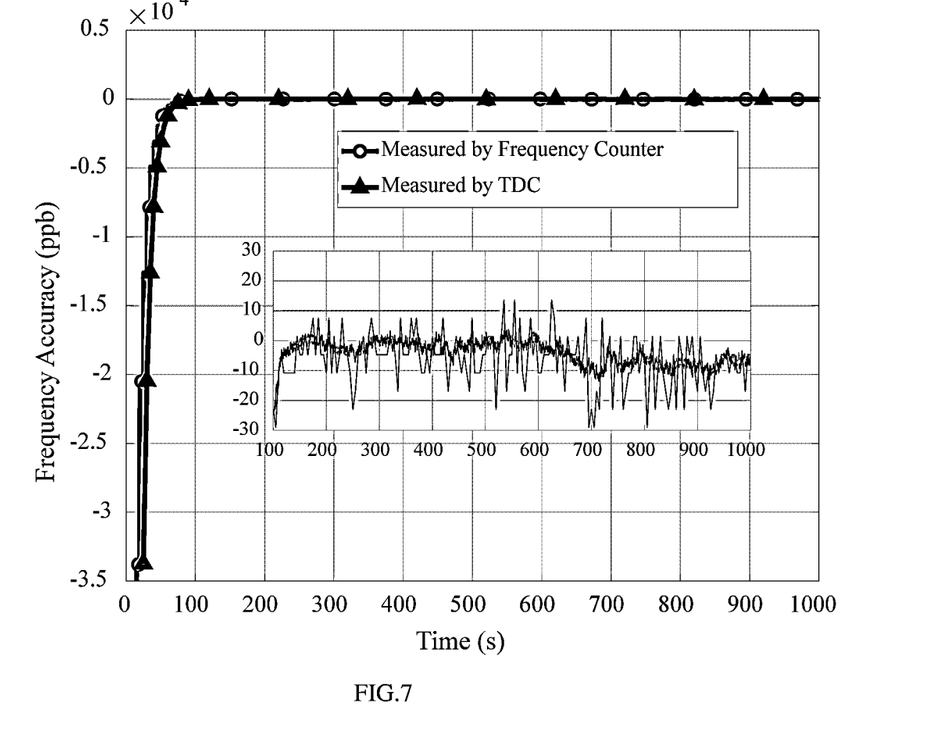
FIG. 7 is another schematic diagram illustrating calibration error versus time according to an implementation of the present disclosure.

Furthermore, we reduce the iteration time from 5 seconds to 1 second, and recalibrate the VCO under the same ambient temperature of 21° C. The calibration results shown in FIGS. 6 and 7 indicate that the proposed model-free adaptive frequency calibration algorithm requires about 20 iterations to reduce the frequency error from ±30 ppm to ±10 ppb and is kept within ±10 ppb.

The present disclosure proposes a new scheme for crystal oscillator frequency calibration. The calibration scheme does not require an accurate mathematical model, and only uses the system I/O data to calibrate the oscillator frequency. The proposed frequency calibration scheme is a low-cost solution with a simple structure. Experimental results show that after about 20 iterations, the frequency accuracy of the VCO is reduced from greater than ±30 ppm to ±10 ppb.

The disclosed embodiment also provides a computer readable storage medium in which a computer program or instruction is stored, and the method is realized when the computer program or instruction is executed.

The disclosed embodiment also provides a computer program product containing instructions which, when run on the computer, cause the computer to execute the method.

The disclosed embodiment also provides a chip coupled with a memory that performs the method described above in this application embodiment.

It should be noted that "coupling" in this application embodiment refers to the combination of two components directly or indirectly with each other.

It should be noted that the terms "system" and "network" in this disclosure embodiment are used interchangeably. "More than one" means two or more, for which reason "more than one" may also be understood as "at least two" in this disclosed embodiment. "And/or": describes the association relationship of the associated object, indicating that there are three relationships. For example, A and/or B can indicate that A exists alone, A and B exist simultaneously, and B exists alone. In addition, the character "/", unless otherwise specified, generally indicates that the related objects are an "or" relationship.

The technical personnel in the field can clearly understand that, for the convenience and simplicity of the description, the specific working process of the system, device and unit described above can refer to the corresponding process in the embodiment of the method mentioned above, which will not be described here.

In the several embodiments presented in this disclosure, it should be understood that disclosed systems, devices, and methods can be implemented in other ways. For example, the division of the unit, which is only a logical function division, can be implemented in other ways, for example, multiple units or components can be combined or integrated into another system, or some features can be ignored or not implemented. The coupling, or direct coupling, or communication connections between each other shown or discussed may be indirect coupling or communication connections through interfaces, devices, or units, and may be electrical, mechanical, or otherwise.

Units described as separate parts may or may not be physically separate, and parts displayed as units may or may not be physical units, that is, may be located in one place, or may be distributed over multiple network units. Part or all of the units can be selected according to the actual needs to achieve the purpose of this embodiment.

In the above embodiments, it may be implemented wholly or partially by software, hardware, firmware, or any combination thereof. When implemented using software, it can be implemented in whole or in part as a computer program product. The computer program product consists of one or more computer instructions. When the instructions of the computer program are loaded and executed on a computer, processes or functions in accordance with this disclosed embodiment are generated in whole or in part. The computer may be a general-purpose computer, a dedicated computer, a computer network, or other programmable device. The computer instructions may be stored in or transmitted through the computer readable storage medium. The computer command can be sent from a web site, computer, server, or data center over wires (such as coaxial cable, optical fiber, digital subscriber line, DSL) or wireless (such as infrared, wireless, microwave, etc.) to another web site, computer, server, or data center. The computer readable storage medium can be any available medium that the computer can access or a data storage device such as a server or data center containing one or more available media integration. The available media may be read-only memory (ROM), or random-access memory (RAM), or magnetic media, such as floppy disks, hard disks, magnetic tapes, magnetic disks, or optical media, such as, digital versatile disc (DVD) or semiconductor media such as solid state disk (SSD).

What is claimed is:

1. A device for frequency calibration for voltage-controlled oscillators, comprising: a frequency divider connected with a voltage-controlled oscillator(VCO), a time-digital converter connected with the frequency divider, a logic controller connected with the time-digital converter, a digital-to-analog converter connected with the voltage-controlled oscillator; wherein:
   the frequency divider is used to divide a signal generated by the voltage-controlled oscillator into N times to get a frequency division signal, where N is a positive integer;
   the time-digital converter is used to measure a time difference of at least two continuous or discontinuous frequency division signals and obtain an actual time period of frequency division signal;
   the logic controller is used to generate the control voltage according to the difference between the actual time period of the frequency division signal and a calibration period of the frequency division signal, and adjust a frequency of the VCO according to the control voltage;
   a relationship between the control voltage and the actual time period of the frequency division signal is as follows:

$\Delta y(k+1) = \varphi(k) \Delta u(k)$ wherein u(k) is the control voltage, y(k+1) is a period of the generated frequency division signal at a k+1-th time instant, $\varphi(k)$ is a time-varying parameter at a k-th time, and
   the logic controller is also used to estimate $\varphi(k)$, get $\hat{\varphi}(k)$ as follows:

$$\hat{\varphi}(k) = \hat{\varphi}(k-1) + \frac{\eta \Delta(k-1)(\Delta y(k) - \hat{\varphi}(k-1)\Delta u(k-1))}{\mu + |\Delta(k-1)|^2}$$

wherein $\hat{\varphi}(k)$ is an estimate of $\varphi(k)$, k is a frequency division time, u(k−1) is the control voltage generated according to the actual time period of measuring k−1 frequency division signal, and y(k) is the period of the frequency division signal generated immediately for the k-th time.

2. The device according to claim 1, wherein when the control voltage increases, the calibration period of the frequency division signal decreases and the frequency of the frequency division signal increases.

3. The device according to claim 1, wherein a frequency division coefficient of the frequency divider is set according to a resolution of the time-digital converter.

4. The device according to claim 1, wherein a relationship between the control voltage and the actual time period of the frequency division signal is as follows:

$y(k+1) = f(y(k), \ldots, y(k-n_y), u(k), \ldots, u(k-n_u))$, wherein u(k) is the control voltage, y(k) is a period of the generated frequency division signal at a k-th time instant.

5. The device according to claim 1, wherein the device also comprising the digital-to-analog converter connected with the logic control circuit and the voltage-controlled oscillator respectively; wherein,
   the digital-to-analog converter is used to convert the control voltage into an analog signal regulating the frequency of the voltage-controlled oscillator.

6. A method for frequency calibration for voltage-controlled oscillators, applied to a device for a frequency calibration for voltage-controlled oscillators, the method comprising:
   dividing, by a frequency divider of the device, a signal generated by a voltage-controlled oscillator of the device that is connected with the frequency divider into N times to get a frequency division signal, where N is a positive integer;
   measuring, by a time-digital converter of the device that is connected with the frequency divider, a time difference of at least two continuous or discontinuous frequency division signals and obtaining an actual time period of frequency division signal; and generating, by a logic controller of the device that is connected with the time-digital converter, a control voltage according to the difference between the actual time period of the frequency division signal and a calibration period of the frequency division signal, and adjusting a frequency of the VCO according to the control voltage, wherein a relationship between the control voltage and the actual time period of the frequency division signal is as follows:

$$\Delta y(k+1) = \varphi(k)\Delta u(k)$$

wherein u(k) is the control voltage, y(k+1) is a period of the generated frequency division signal at a k+1-th time instant, φ(k) is a time-varying parameter at a k-th time, and wherein the logic controller is also used to estimate φ(k), get $\hat{\varphi}(k)$ as follows:

$$\hat{\varphi}(k) = \hat{\varphi}(k-1) + \frac{\eta \Delta u(k-1)(\Delta y - \hat{\varphi}(k)\Delta u(k-1))}{\mu + |\Delta u(K-1)|^2}$$

wherein $\hat{\varphi}(k)$ is an estimate of φ(k), k is a frequency division time, u(k−1) is the control voltage generated according to the actual time period of measuring k−1 frequency division signal, and y(k) is the period of the frequency division signal generated immediately for the k-th time.

7. A chip for frequency calibration for voltage-controlled oscillators, wherein the chip is coupled with a memory to perform the method described in claim 6.

8. A non-transitory computer readable storage medium, wherein including instructions that, when run on a computer, cause the computer to perform the method described in claim 6.

* * * * *